United States Patent
Goller

(10) Patent No.: US 7,668,022 B2
(45) Date of Patent: Feb. 23, 2010

(54) INTEGRATED CIRCUIT FOR CLOCK GENERATION FOR MEMORY DEVICES

(75) Inventor: Joerg Goller, Zweikirchen (DE)

(73) Assignee: Texas Instruments Deutschland GmbH, Freising (DE)

( * ) Notice: Subject to any disclaimer, the term of this patent is extended or adjusted under 35 U.S.C. 154(b) by 103 days.

(21) Appl. No.: 12/110,684

(22) Filed: Apr. 28, 2008

(65) Prior Publication Data

US 2008/0265967 A1     Oct. 30, 2008

Related U.S. Application Data

(60) Provisional application No. 61/016,674, filed on Dec. 26, 2007.

(30) Foreign Application Priority Data

Apr. 27, 2007   (DE)   ................ 10 2007 020 005

(51) Int. Cl.
*G11C 7/10* (2006.01)

(52) U.S. Cl. ............. 365/189.05; 365/154; 365/189.11; 365/233.1

(58) Field of Classification Search ................ 365/154, 365/189.11, 189.05, 233.1
See application file for complete search history.

(56) References Cited

U.S. PATENT DOCUMENTS 5,909,247 A    6/1999   Hosokai et al.

2002/0015338 A1    2/2002   Lee
2002/0172079 A1 *  11/2002  Hargis et al. ................ 365/193
2005/0218956 A1   10/2005  LaBerge
2007/0002641 A1    1/2007   Kim et al.

* cited by examiner

*Primary Examiner*—Hoai V Ho
*Assistant Examiner*—Jason Lappas
(74) *Attorney, Agent, or Firm*—John J. Patti; Wade J. Brady, III; Frederick J. Telecky, Jr.

(57) ABSTRACT

A device for generating clock signals for use with a plurality of DDR memory devices on a dual in-line memory module (DIMM) board is provided that has a data buffer for buffering data. A clock divider divides a first clock signal (CLK1) having a first clock frequency to generate a second clock signal (CLK20) having a second clock frequency which is an integer multiple of the first clock frequency. A shift register (SH) receives the second clock signal as a data input signal, and comprises a plurality of flip-flops having clock inputs coupled to receive the first clock signal (CLK1), and further coupled so that the data output of a preceding flip-flop is coupled to be the data input of a following flip-flop. The second clock signal is shifted through the shift register (SH) in response to the first clock signal (CLK1) to generate a plurality of shifted clock signals (CLK 21, . . . , CLK32) at respective data outputs of the plurality of flip-flops. A multiplexer commonly coupled to the data outputs of the flip-flops selects one of the shifted clock signals (CLK 21, . . . , CLK32) to serve as an output clock signal for transmission of the buffered data to a memory device.

8 Claims, 5 Drawing Sheets

INTEGRATED CIRCUIT FOR CLOCK GENERATION FOR MEMORY DEVICES

This patent application claims priority from German Patent Application No. 10 2007 020 005.8, filed 27 Apr. 2007, and from U.S. Provisional Patent Application No. 61/016,674, filed 26 Dec. 2007.

FIELD OF THE INVENTION

The invention relates to an integrated electronic device for generating clock signals for DDR memory devices.

BACKGROUND

On a typical buffered dual in-line memory module (DIMM) board, a number of memory modules and a memory buffer are arranged. The memory buffer constitutes the interface between the memory controller and the memory modules spread over the board. The memory modules (as for example DRAMs) require a specific and precise timing at their data, address and clock inputs. As the memory boards (DIMM boards) have a dense routing in terms of numerous wires, providing suitable and exact timing of the data and address signals, as well as the corresponding clock signals, places a high requirement on the memory buffers. If the memory buffers fail to meet the requirements, the timing at the inputs to the memory devices may be different from the timing at the corresponding outputs of the controlling devices, which may impair the overall performance of the memory systems. In order to satisfy the different timing requirements, conventional solutions shift the phase of the clock signals. For this purpose, phase locked loops (PLL) with phase mixers or delay locked loops (DLL) are used to optimize the phase relationship of a clock signal with regard to a data signal. However, PLLs and DLLs consume a considerable amount of chip area. Further, as data throughput of the memory buffering devices increases, the power consumption and the heat produced in the memory buffering devices, in particular in the DLLs and PLLs, creates problems.

SUMMARY

It is an object of the invention to provide an electronic device for generating clock signals for DDR memory devices on DIMM boards suitable to flexibly satisfy the timing requirements, while being small in size and having less power consumption and less area consumption.

An electronic device for generating clock signals for DDR memory devices on DIMM boards according to a described example embodiment is adapted to transfer data and clock signals to and/or from a plurality of memory devices on a DIMM board. The electronic device includes a data buffer for buffering data; a clock divider for dividing a first clock signal having a first clock frequency to generate a second clock signal having a second clock frequency, the second clock frequency being an integer multiple of the first clock frequency; and a shift register including multiple flip-flops. The flip-flops have clock inputs for receiving the first clock signal. The shift register receives the second clock signal as a data input signal. In the shift register, the data output of a preceding flip-flop is coupled to the data input of a following flip-flop, so as to shift the second clock signal through the shift register in response to the first clock signal, thereby generating a plurality of shifted clock signals at the outputs of the flip-flops. A multiplexer coupled to the outputs of the flip-flops for selecting a shifted clock signal serves as an output clock signal for transmission of the buffered data to a memory device.

A memory buffer according to a described embodiment exploits the presence of two different clock signals (first and second clock signals) with different clock frequencies to generate a respective phase-shifted clock output signal to be used for data transmission of the buffered data. Clock dividers and shift registers were generally considered to be inappropriate for high speed and high precision clock generation, as the jitter contributed by each flip-flop adds up. The summed jitter of the preceding flip-flops in the clock divider and the shift register may then appear in the output clock signal, rendering the clock signal unsuitable for high speed applications. Yet, based on the recognition that the first clock signal can have a sufficiently small jitter, the invention may be implemented to overcome this prejudice.

The first clock signal is processed in a clock divider, the frequency of which is a fraction of the frequency of the first clock signal. Instead of using a PLL or a DLL architecture to produce a phase-shifted clock signal with an optimum phase relationship to the data to be transmitted, the invention may be implemented to make use of a shift register which is appropriately coupled to the first and the second clock. Each flip-flop of the shift register is clocked by the first clock signal and generates at its output a phase-shifted version of the second clock signal being delayed with respect to the second clock signal by one clock cycle of the first clock for each flip-flop. The so-produced phase-shifted clock signals are fed to a multiplexer, which is adapted to select one phase-shifted clock signal to be used for data transmission of the buffered data. Dependent on the respective requirements for a specific data transmission, an optimum clock signal can be selected. Since the memory buffer according to the described embodiment does not need PLLs or DLLs, power consumption and heat generation is considerably reduced with regard to conventional solutions. The chip area consumed by the shift register is much smaller than the area required by a PLL or DLL.

The electronic device, and in particular the shift register, implemented in accordance with the invention as described, may preferably be adapted to receive, to process and to output differential signals. Accordingly, the first clock signal may be a differential clock signal and the flip-flops of the shift register are preferably adapted to be clocked by the differential first clock signal. Further, the second clock signal may be a differential clock signal and the plurality of flip-flops of the shift register may be adapted to process the second clock signal as a differential data signal. A first group of the flip-flops of the shift register may be coupled to operate in response to a rising edge of the first clock signal, and a second group of the flip-flops of the shift register may be coupled to operate in response to a falling edge of the first clock signal, by simply interchanging the differential first clock signals at the clock inputs of the second group of flip-flops. An inverter, which would introduce unwanted phase shift, is not required. Further, according to this aspect of the implementation of the invention, only half a period of the fast clock signal is used for generating the phase-shifted derivatives of the second clock signal, which reduces granularity to half the clock period of the first clock signal (i.e., to ½ UI, where UI is a unit interval). By using differential flip-flops, any additional unwanted phase shift or skew due to inverters (or other additional gates) to produce inverted clock signals is avoided. Further, using flip-flops with differential clock and data inputs and differential data outputs allows the phase-shifted output clock signals to be produced using only half the number of flip-flops. If necessary, an electronic device according to the invention may further include clock generating means for recovering the first clock signal from the input data.

According to another aspect of the invention, the electronic device may further include circuitry for generating a third clock signal and a fourth clock signal from the first clock signal, wherein the third clock signal and the fourth clock signal are clock signals that are non-overlapping with respect to each other. Further, an electronic device according to an implementation of the invention may include a special flip-flop, which includes a first master stage for storing a first binary value in response to the third clock signal, a second master stage for storing a second binary value in response to the fourth clock, and a slave stage which is coupled to the first and the second master stages to receive and to store either the first or the second binary value in response to a fifth clock having twice the frequency of the input clock. This aspect of the invention relates to double data rate memory devices (DDR).

Data, which is to be written to the memory devices, is stored in a write FIFO for memory buffer applications. Typically, there are two banks of write FIFOs (for example, one bank for even and another bank for odd clock cycles) which run based on the second clock and an inverted second clock. The even and the odd data stored in the FIFO are re-sampled at twice the core frequency (frequency of the second clock). This usually requires use of a multiplexer, the select line of which is controlled by the core clock and a flip-flop run at twice the frequency. This conventional approach requires an additional clock having twice the clock rate of the core clock. Further, the conventional approach introduces additional latency. The approach according to some embodiments of the invention, in particular a new dual flip-flop architecture, reduces latency by at least six unit intervals (UI)—a unit interval being the length of one clock period of the first clock signal. This advantage is achieved by the newly provided architecture of the flip-flop. Accordingly, two master stages are clocked by two non-overlapping clock signals, such that single bit values are clocked into the two master stages in an alternating manner. A clock having twice the frequency of the input clock is used to clock the data from a selected one of the master stages to the single slave stage which is coupled to both master stages.

The first clock signal is source centered with respect to the data signals. Data signals in the context of the invention include command and address signals, as well as strobe signals or the like. The internal core clock of the memory buffer is preferably one of the shifted clock signals generated by the shift register. The multiplexer is preferably implemented as a tri-state solution comprising a plurality of tri-state buffers. The tri-state buffers are implemented to introduce the same phase shift relative to the respective clock signals. This is typically done by matching the layouts and wire lengths of the interconnections of the tri-state buffers. All clock signals are routed to the interface via a global clock tree with minimum skew and insertion delay, as well as balanced buffers which do not introduce duty cycle distortion. One of the shifted clock signals may be used as a core clock for generating the data as, for example, command and address signals or strobe signals.

The invention also provides a system for digital data processing. The system includes at least a DIMM board with (e.g., DDR) memory modules and an electronic device for generating clock signals and buffering data. The electronic device may be configured as set out above and include a shift register to derive a plurality of clock signals from a second clock by use of first clock, wherein the first clock has a clock frequency which is an integer multiple of the second clock.

The relationship between the frequencies of the first and the second clocks may also include fractions of the first clock including, preferably, half a period of the first clock. This can be done by using, for example, rising and falling edges of the first clock.

In another aspect, the invention also provides a method for buffering data and generating clock signals for a plurality of memory modules on a DIMM board. The method according to the invention includes buffering input data for the memory modules, dividing the first clock signal (e.g., by a positive integer) to receive a second clock signal, and deriving a plurality of clock signals from the second clock signal by sequentially shifting the second signal using, e.g., the rising and/or falling edges of the first clock signal.

DETAILED DESCRIPTION OF THE DRAWINGS

Example embodiments of the invention are described below with reference to accompanying drawings, wherein.

DETAILED DESCRIPTION OF EXAMPLE EMBODIMENTS

Figure 1:
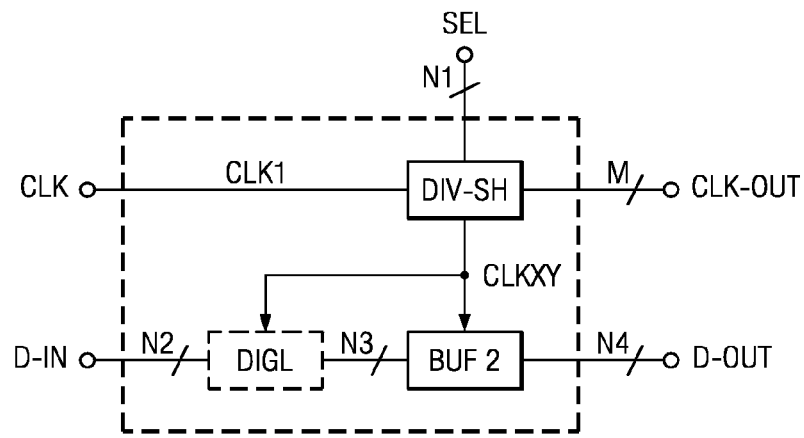
FIG. 1 shows a simplified block diagram of an embodiment of the invention.

FIG. 1 shows a simplified block diagram of an example implementation of the invention. A data input receives data from a memory controller or the like (not shown). The input data D-IN applied at data input terminal has a bus width of N2. A clock input CLK receives a first clock signal CLK1 in the form of a high speed clock. The input data D-IN comprises all kinds of data, address information and control information to be exchanged with memory modules on a DIMM board. The first clock signal CLK1 is divided by a clock divider in block DIV-SH to derive a second clock signal CLK20 (not shown in FIG. 1) having a lower frequency. The frequency of the first clock signal CLK1 will typically be an integer multiple of the frequency of the second clock signal CLK20. Block DIV-SH also includes an internal shift register which may be similar to those described below in connection with FIGS. 2 and 3. The shift register provides a plurality of phase-shifted derivatives of the second clock signal, a selected one of which may be chosen in response to applied selection signals SEL of bus width N1. Clock signals CLKXY and CLK-OUT have the specific phase of one (or more in the case of a bus) of the phase-shifted derivatives of clock CLK20, determined according to the applied selection signals SEL.

Clock signal CLKXY is used as a core clock. CLKXY has the same frequency as CLK20 and a specific phase relationship with respect to CLK20 and CLK1. The phase of CLKXY is selected by one or more of the selection signals SEL. Also, the phase-shifted clock signals at the output pins CLK_OUT of bus width M are selected by selection signals SEL. The block designated by DIGL represents various additional digital logic, buffers or combinatorial logic which may be coupled between the input D-IN and an output buffer BUF2. The bus width for data, command and address signals will vary according to the specific architecture of a particular implementation. Thus, the reference numbers N1, N2, N3, N4 and M represent different possible bus width combinations.

Figure 2:
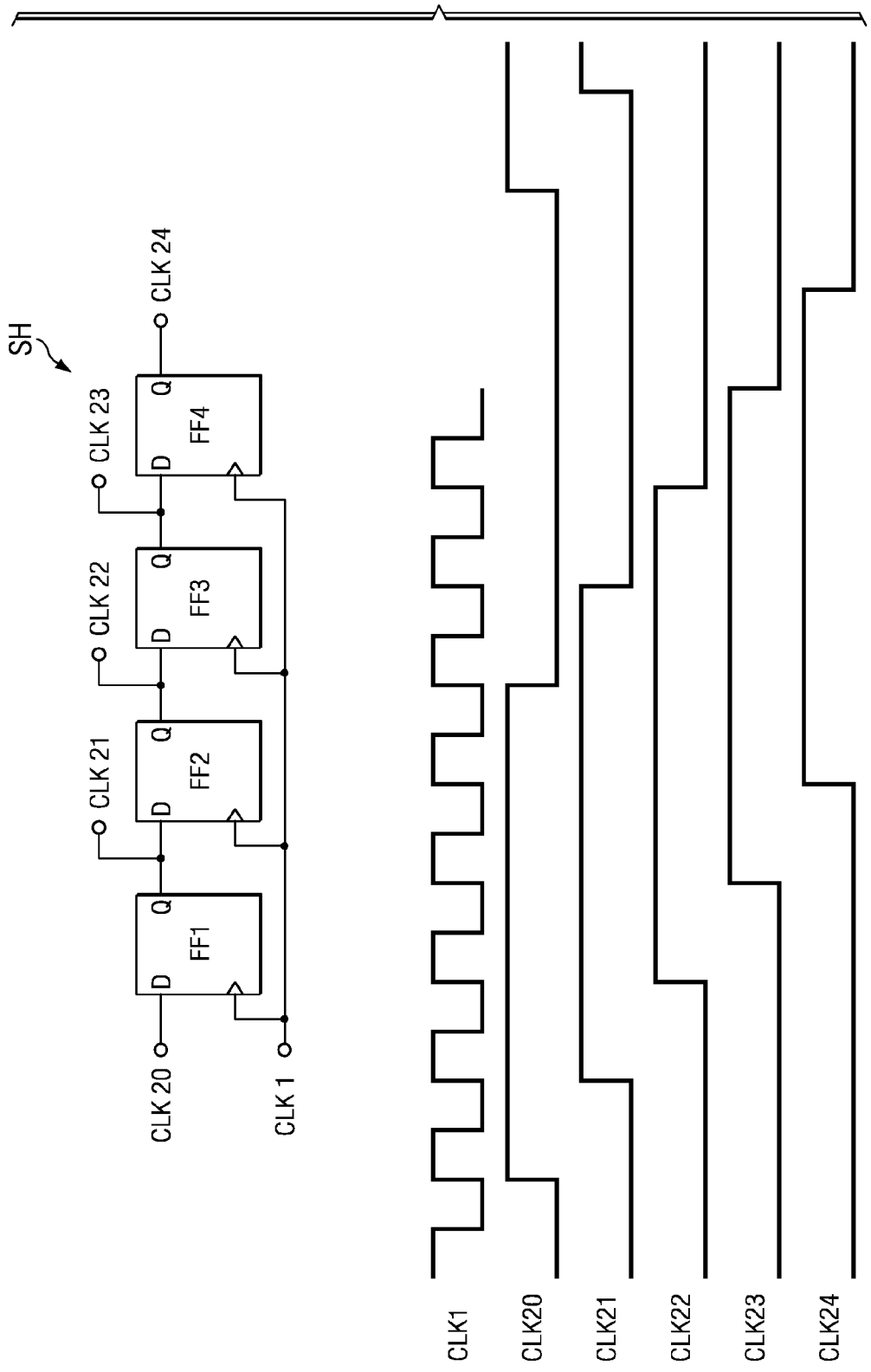
FIG. 2 shows a simplified schematic and a timing diagram of a shift register according to an embodiment of the invention.

FIG. 2 shows in more detail an example implementation of a shift register of the type implemented in block DIV-SH. The second clock signal CLK20 is fed as an input signal to the data input D of a first flip-flop FF1. The first clock signal CLK1, with a frequency that is an integer multiple of the frequency of the second clock signal, is fed to the clock inputs of the flip-flops. The flip-flops FF1, FF2, FF3 and FF4 are coupled in typical shift register configuration, with the output Q of each preceding flip-flop (e.g., Q of FF1) coupled to the data input D of each following flip-flop (e.g., D of FF2). In this way, a number of phase-shifted clock signals CLK21, CLK22, CLK23 and CLK24 are produced, each being shifted by one clock cycle with respect to a preceding clock signal.

Figure 3:
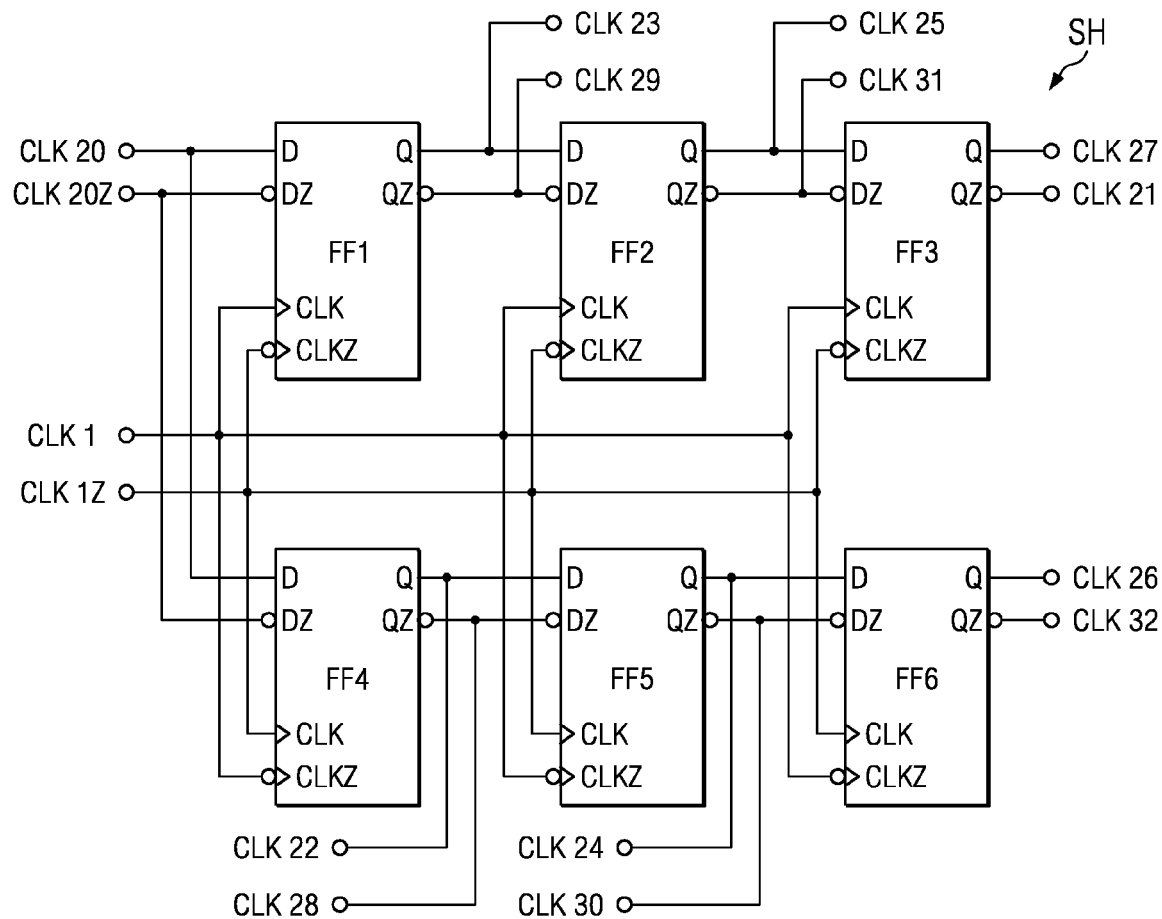
FIG. 3 shows a simplified schematic of a differential shift register according to an embodiment of the invention.

FIG. 3 shows a simplified schematic of a differential shift register implementation according to an example embodiment of the invention. The differential shift register comprises six flip-flops FF1 to FF6. All flip-flops receive differential clock signals CLK1 and CLK1Z, where CLK1Z is the inverted version of CLK1. (A "Z" used at the end of the reference legend of a signal indicates the inverted form of the signal without the "Z"). The frequency of differential clock signals CLK20, CLK20Z is substantially smaller than the frequency of CLK1, CLK1Z. In the present embodiment, the frequency of CLK1 may, e.g., be six times the frequency of CLK20. CLK20 can be derived from CLK1 in known ways using a clock divider. The circuit shown in FIG. 3 serves to provide twelve derivative clock signals CLK21-CLK32 of the slower clock CLK20. Flip-flops FF1, FF2 and FF3 are clocked by the rising edge of CLK1, whereas FF4, FF5 and FF6 are clocked by the falling edge of CLK1 (i.e., the rising edge of CLK1Z). This is achieved by simply interchanging the differential clock signals CLK1, CLK1Z at the clock inputs of the two groups of flips-flops. An additional inverter is not needed. Therefore, e.g., for DDR applications, using differential clock signals, such as CLK1 and CLK1Z, in a fully differential approach without an inverter is particularly useful. The propagation delay of even a single inverter (or any other single gate) would introduce additional and unwanted phase shift in the range of several percent of the period of the clock signals. Because the rising and falling edges of the fast CLK1 are used, the derivatives CLK21-CLK32 are shifted with respect to each other by half the period of CLK1 (½ UI). So, the granularity of the phase shifter is reduced to ½ UI of the fast clock CLK1.

Preferably, CLK20 may be inverted before being fed to the input of the phase shifter shown in FIG. 3. This may be helpful to compensate for the delays (including setup and hold times and propagation delays, etc.) of the flip-flops. The phase shifter shown in FIG. 3 may preferably be used in the DIV-SH stage shown in FIG. 1. The phase shifter may be adapted to accommodate different numbers of phase-shifted clock derivatives, as needed.

Figure 4:
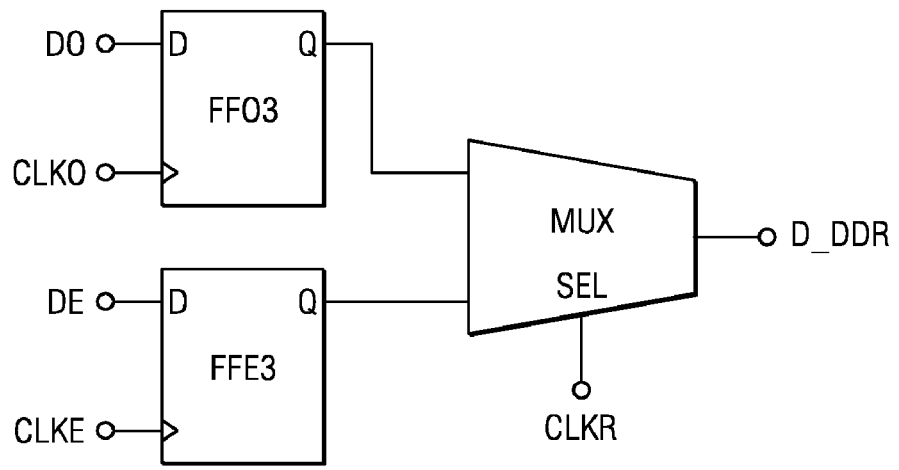
FIG. 4 shows a schematic of a conventional double data rate generator.

FIG. 4 shows a simplified schematic of a configuration used in prior art electronic devices for double data rate data output. In the memory buffer, the data to be written to the memory devices is to be stored in a write FIFO for the different memory buffer applications. There are typically two banks of write first-in first-out (FIFO) buffers FF03 and FFE3, which run from the core clock CLKO and the inverted core clock CLKE. The data stored in FF03 and FFE3 is alternately fed by multiplexer MUX to the output pin (or pins) D_DDR by a core clock CLKR having twice the frequency of the clock signals CLKO and CLKE used for the FIFOs. Therefore, the approach shown in FIG. 4 requires an additional clock at twice the frequency of the core clock rate and adds latency.

Figure 5:
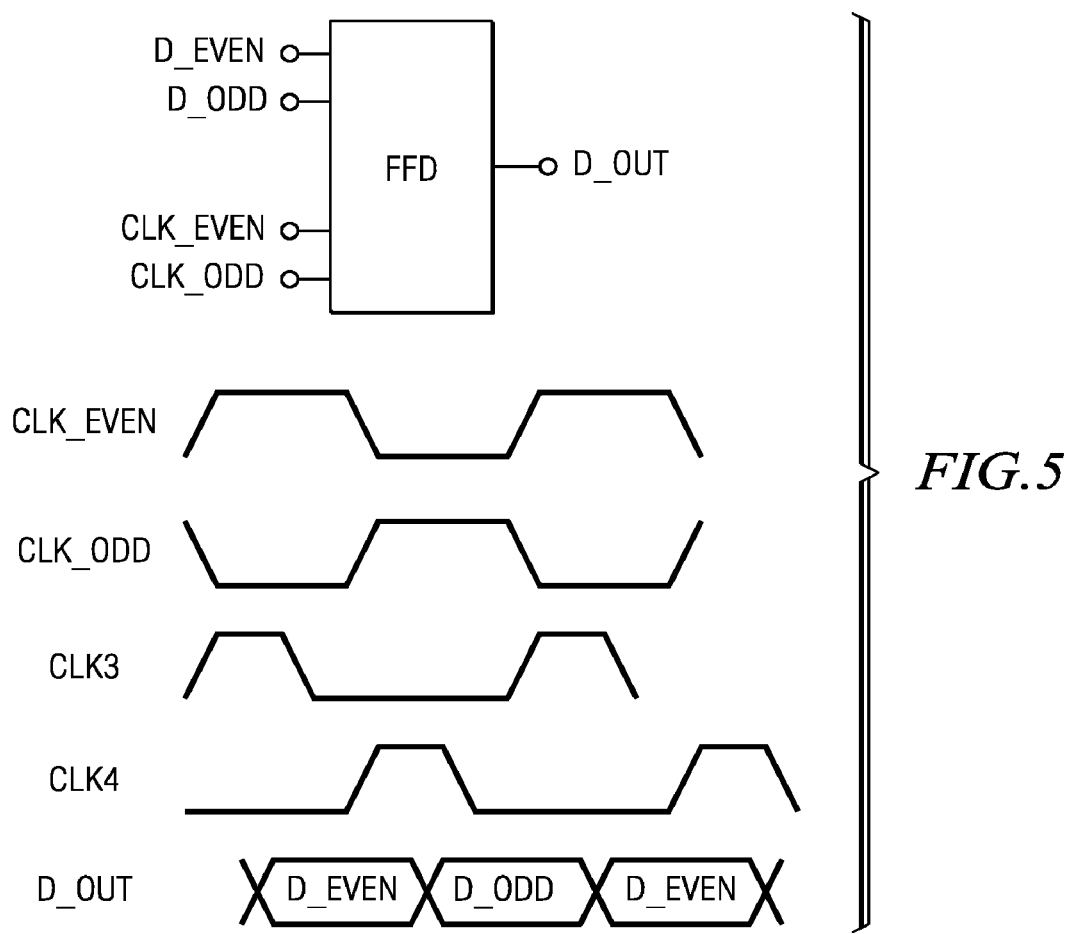
FIG. 5 shows a top level block diagram of a flip-flop according to the invention.

FIG. 5 shows a simplified block diagram of an example flip-flop according to an aspect of the invention. As with the conventional approach, two complementary clock signals CLK_EVEN and CLK_ODD are fed to the flip-flop FFD. Further, corresponding data signals D_EVEN and D_ODD are supplied to the flip-flop. In the example implementation according to the invention, the flip-flop (or additional circuitry) generates two non-overlapping clock signals CLK3 and CLK4 as illustrated by the waveforms below the flip-flop, and the data D_EVEN and D_ODD is source centered with respect to either CLK3 or CLK4.

Figure 6:
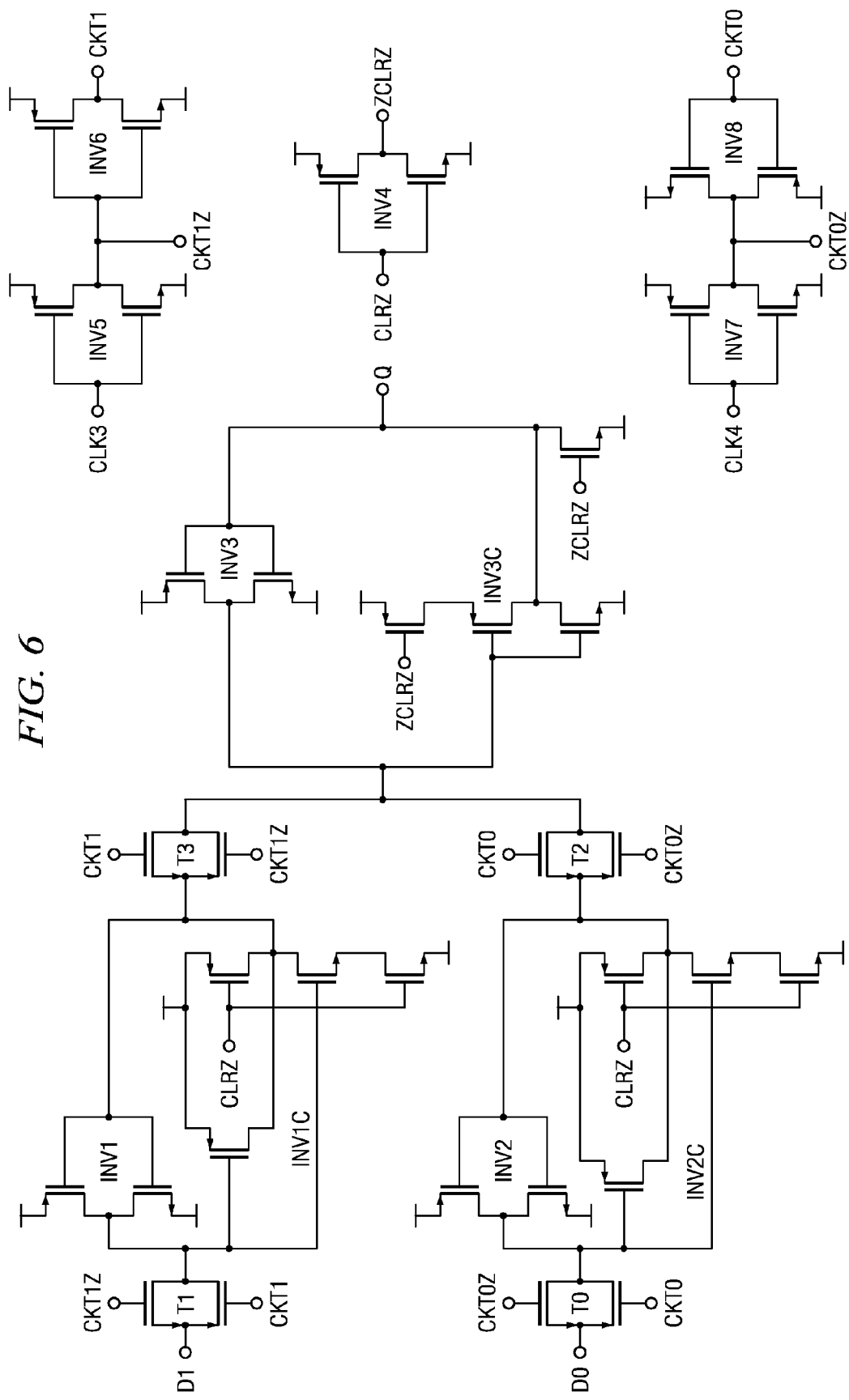
FIG. 6 shows a detailed schematic of a flip-flop according to the invention.

FIG. 6 shows a more detailed schematic of the flip-flop of FIG. 5. The first master stage includes two transmission gates T1 and T3 being clocked by respective clock signals CKT1, CKT1Z, where CKT1Z is the inverted clock with respect to CKT1. Further, the first master stage includes inverters INV1 and clocked inverter INV1C. The second master stage includes the two transmission gates T0, T2 and inverter INV2, as well as clocked inverter INV2C. The slave stage includes inverters INV3 and clocked inverter INV3C. The slave stage is coupled to the outputs of both master stages via transmission gates T3 and T2. The master stages receive respective data signals D1 and D0, one being the even, the other being the odd data as explained with respect to FIG. 5. Accordingly, the first master stage stores the data received via input pin D1 and the second master stage stores the data received via input pin D0. The clock signals CKT1, CKT1Z, CKT0, CKT0Z may be derived in known ways from the third and the fourth clock signals CLK3 and CLK4 shown in FIG. 5. Further, an inverted version ZclRZ of the clock signal clRZ is produced by inverter INV4. Inverters INV5-INV8 are used for clock signals CKT1, CKT1Z, CKT0, CKT0Z.

With respect to the prior art circuit shown in FIG. 4, the flip-flop implementation according to the invention saves a considerable amount of chip area. Each of the flip-flops shown in FIG. 5 includes at least a master and a slave stage. The invention provides the same, or even a better functionality in terms of speed and power dissipation, and saves the multiplexer, the control logic and signals for the multiplexer and a slave stage.

Figure 7:
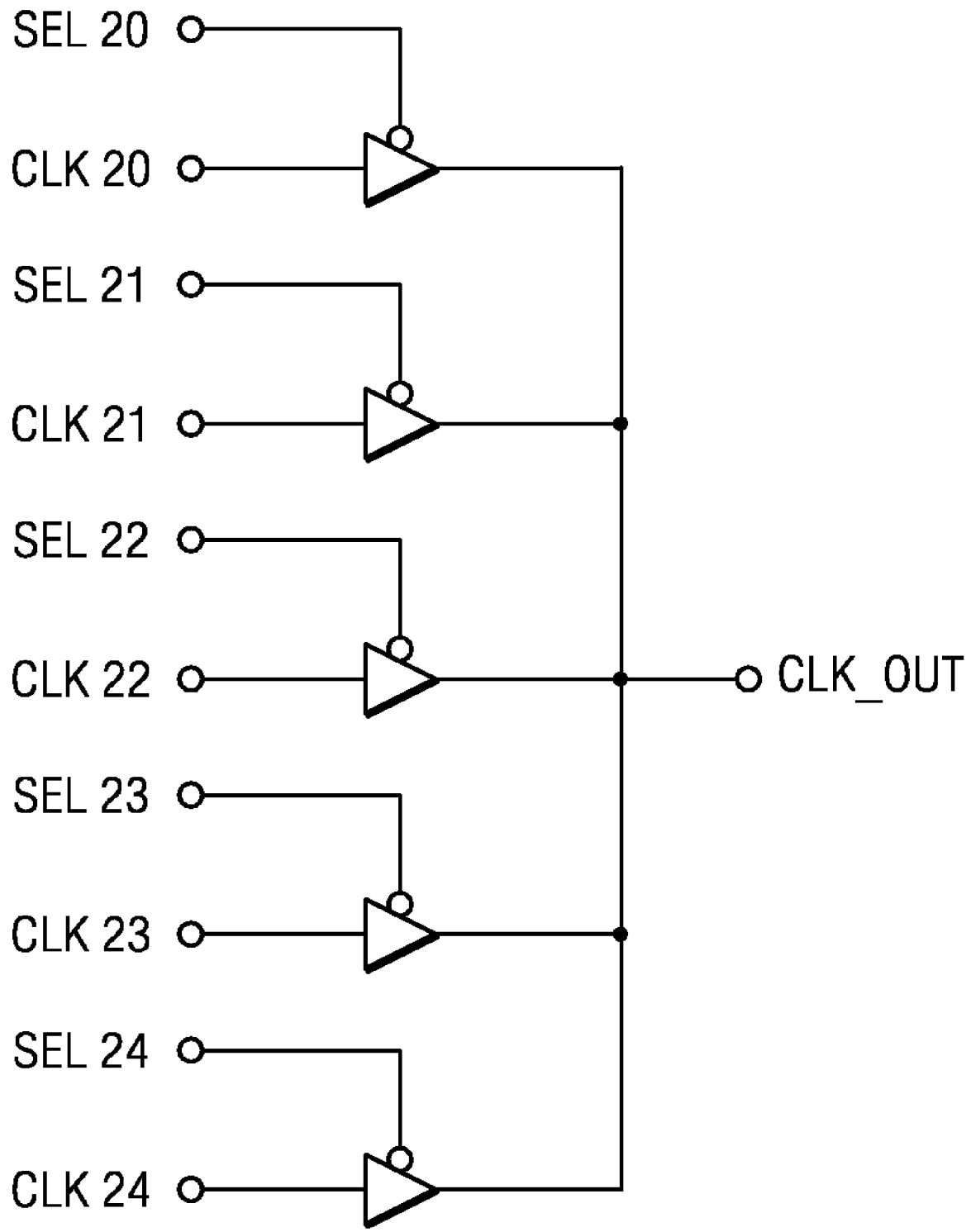
FIG. 7 shows a clock signal selection circuit according to the invention.

FIG. 7 shows an example of a tri-state buffer according to the invention. The clock signals CLK20, CLK21, CLK22, CLK23 and CLK24 are supplied respectively to a number of tri-state buffers, each having a corresponding selection input SEL20, SEL21, SEL22, SEL23 and SEL24. The output signal CLK_OUT is selected from the phase-shifted clock input signals CLK20-CLK24 in response to the applied selection signals. The tri-state buffers of the clock signals which are not selected can be set in a high impedance state. The tri-state buffer may preferably be used in the DIV-SH block of FIG. 1. The tri-state buffer may be adapted to any specific number of phase-shifted derivatives of the clock signals.

Those skilled in the art to which the invention relates will appreciate that the described implementations are merely representative examples, and that many other implementations are possible within the scope of the claimed invention.

What is claimed is:

1. A device for generating clock signals in association with a plurality of DDR memory devices on a dual in-line memory module (DIMM) board, the electronic device comprising:
   a data buffer for buffering data;

a clock divider for dividing a first clock signal having a first clock frequency to generate a second clock signal having a second clock frequency, the second clock frequency being an integer multiple of the first clock frequency;

a shift register coupled to receive the second clock signal as a data input signal; the shift register comprising a plurality flip-flops having clock inputs coupled to receive the first clock signal, and being further coupled so that a data output of a preceding flip-flop is coupled to a data input of a following flip-flop so as to shift the second clock signal through the shift register in response to the first clock signal, thereby generating a plurality of shifted clock signals at the respective data outputs of the plurality of flip-flops; and a multiplexer commonly coupled to the data outputs of the flip-flops for selecting a shifted clock signal to serve as an output clock signal for transmission of the buffered data to a memory device.

2. The device of claim 1, wherein the first clock signal is a differential clock signal and the plurality of flip-flops are coupled to be clocked by the differential first clock signal.

3. The device of claim 1, wherein the second clock signal is a differential clock signal and the plurality of flip-flops are coupled to process the second clock signal as a differential data signal.

4. The device of claim 1, wherein a first group of the flip-flops is coupled to operate in response to a rising edge of the first clock signal, and a second group of the flip-flops is coupled to operate in response to a falling edge of the first clock signal. by coupling the second group of flip-flops.

5. The electronic device of claim 1, further comprising a clock generator for recovering the first clock signal from input data.

6. The device of claim 1, further comprising;

circuitry for generating a third clock signal and a fourth clock signal from the first clock signal; wherein the third clock signal and the fourth clock signal are non-overlapping with respect to each other;

a flip-flop circuit comprising a first master stage for storing a first binary value in response to the third clock signal and a second master stage for storing a second binary value in response to the fourth clock signal; and a slave stage coupled to the first and the second master stages, to receive and to store either a first or the second binary value in response to a fifth clock signal having twice the frequency of an input clock.

7. A system for digital data processing, comprising at least one DIMM board having multiple memory modules and a device for generating clock signals in association with a plurality of DDR memory devices on a dual in-line memory module (DIMM) board, the device comprising:

a data buffer for buffering data;

a clock divider for dividing a first clock signal having a first clock frequency to generate a second clock signal having a second clock frequency, the second clock frequency being an integer multiple of the first clock frequency;

a shift register coupled to receive the second clock signal as a data input signal; the shift register comprising a plurality flip-flops having clock inputs coupled to receive the first clock signal, and being further coupled so that a data output of a preceding flip-flop is coupled to a data input of a following flip-flop so as to shift the second clock signal through the shift register in response to the first clock signal, thereby generating a plurality of shifted clock signals at the respective data outputs of the plurality of flip-flops; and a multiplexer commonly coupled to the data outputs of the flip-flops for selecting a shifted clock signal to serve as an output clock signal for transmission of the buffered data to a memory device.

8. A method for generating clock signals for a plurality of memory modules on a DIMM board, comprising:

buffering input data to be transferred to the memory modules;

dividing a first clock signal to derive a second clock signal; and deriving a plurality of additional clock signals from the second clock signal by sequentially shifting the second clock signal according to timing established by at least one of the rising edges and falling edges of the first clock signal.

* * * * *